United States Patent

Fujita et al.

(10) Patent No.: US 9,882,088 B2
(45) Date of Patent: Jan. 30, 2018

(54) III NITRIDE SEMICONDUCTOR LIGHT-EMITTING DEVICE

(71) Applicant: DOWA ELECTRONICS MATERIALS CO., LTD., Tokyo (JP)

(72) Inventors: Takehiko Fujita, Tokyo (JP); Yasuhiro Watanabe, Tokyo (JP)

(73) Assignee: DOWA ELECTRONICS MATERIALS CO., LTD., Tokyo (JP)

(*) Notice: Subject to any disclaimer, the term of this patent is extended or adjusted under 35 U.S.C. 154(b) by 45 days.

(21) Appl. No.: 15/066,234

(22) Filed: Mar. 10, 2016

(65) Prior Publication Data

US 2016/0268477 A1 Sep. 15, 2016

(30) Foreign Application Priority Data

Mar. 11, 2015 (JP) .................... 2015-048508

(51) Int. Cl.
  *H01L 33/32* (2010.01)
  *H01L 33/14* (2010.01)
  *H01L 33/00* (2010.01)

(52) U.S. Cl.
  CPC .......... *H01L 33/32* (2013.01); *H01L 33/007* (2013.01); *H01L 33/145* (2013.01)

(58) Field of Classification Search
  CPC .... H01L 33/32; H01L 33/0075; H01L 33/145
  See application file for complete search history.

(56) References Cited

U.S. PATENT DOCUMENTS

| 2004/0104399 A1* | 6/2004 | Ou ............ H01L 33/025 257/102 |
| 2006/0203871 A1* | 9/2006 | Ueda .......... H01S 5/32341 372/43.01 |

(Continued)

FOREIGN PATENT DOCUMENTS

| JP | H11-186601 A | 7/1999 |
| JP | 2010-205767 A | 9/2010 |

(Continued)

OTHER PUBLICATIONS

Dec. 20, 2016 Office Action issued in Japanese Patent Application No. 2015-048508.

(Continued)

*Primary Examiner* — Dung Le
(74) *Attorney, Agent, or Firm* — Oliff PLC (57) ABSTRACT

A long-life III nitride semiconductor light emitting device and a method of producing the same. A III nitride semiconductor light-emitting device includes an n-type semiconductor layer; a light emitting layer containing at least Al; and a p-type semiconductor layer obtained by sequentially stacking an electron blocking layer, a p-type cladding layer, and a p-type contact layer, in this order. The electron blocking layer is made of $Al_xGa_{1-x}N$ ($0.55 \leq x \leq 1.0$), the p-type contact layer is made of $Al_yGa_{1-y}N$ ($0 \leq y \leq 0.1$), the p-type cladding layer is made of $Al_zGa_{1-z}N$ having an Al content z which gradually decreases over the whole thickness of the p-type cladding layer from the electron blocking layer side toward the p-type contact layer side, and the reduction rate of the Al content z of the p-type cladding layer in the thickness direction is 0.01/nm or more and 0.025/nm or less.

5 Claims, 3 Drawing Sheets (56) References Cited

U.S. PATENT DOCUMENTS

2011/0240957 A1* 10/2011 Okuno .................. H01L 33/04
257/13
2015/0083994 A1* 3/2015 Jain .................... H01L 33/0025
257/13

FOREIGN PATENT DOCUMENTS

| JP | 2012-146847 A | 8/2012 |
| JP | 2014-154597 A | 8/2014 |
| JP | 2014-241397 A | 12/2014 |

OTHER PUBLICATIONS

Oct. 27, 2017 Office Action issued in Chinese Patent Application No. 201610140279.2.
Nov. 7, 2017 Office Action issued in Japanese Patent Application No. 2015-048508.

* cited by examiner

III NITRIDE SEMICONDUCTOR LIGHT-EMITTING DEVICE

TECHNICAL FIELD

This disclosure relates to a III nitride semiconductor light-emitting device and a method of producing the same. This disclosure relates in particular to a long-life III nitride semiconductor light-emitting device and a method of producing the same.

BACKGROUND

Conventionally, III nitride semiconductors made of compounds of N with Al, Ga, In, and the like are used as materials for ultraviolet light-emitting devices. III nitride semiconductors made of high-Al-content AlGaN are particularly used for ultraviolet light-emitting devices or deep ultraviolet light light-emitting devices (DUV-LED) emitting light at a wavelength of 300 nm or less.

Examples of the characteristics required of a light-emitting device include high external quantum efficiency properties and low resistance properties. JP 2010-205767 A (PTL 1) describes that a layer serving as an energy barrier for electrons, which is called an electron blocking layer, is formed between a light emitting layer having a quantum well structure and a p-type cladding layer, thereby improving the light emission efficiency.

CITATION LIST

Patent Literature

PTL 1: JP 2010-205767 A

SUMMARY

A light-emitting device fabricated by a method of PTL 1 has high light output power; however, there is room for improvement in its life. In view of the above, it could be helpful to propose a long-life III nitride semiconductor light-emitting device and a method of producing the same.

The inventors of the present invention have intensively studied ways to solve the above problems. As a result, they found that it is beneficial to gradually reduce the Al content of a p-type cladding layer over the whole thickness of the p-type cladding layer from the electron blocking layer side toward the p-type contact layer side and to control the rate of reduction of the Al content of the p-type cladding layer in the thickness direction to 0.01/nm or more and 0.025/nm or less. Thus, they made the present invention.

Specifically, summary of the present disclosure is as follows.

(1) A III nitride semiconductor light-emitting device including an n-type semiconductor layer; a light emitting layer containing at least Al; and a p-type semiconductor layer obtained by sequentially stacking an electron blocking layer, a p-type cladding layer, and a p-type contact layer, in this order, wherein the electron blocking layer is made of $Al_xGa_{1-x}N$ ($0.55 \leq x \leq 1.0$), the p-type contact layer is made of $Al_yGa_{1-y}N$ ($0 \leq y \leq 0.1$), the p-type cladding layer is made of $Al_zGa_{1-z}N$ having an Al content z which gradually decreases over the whole thickness of the p-type cladding layer from the electron blocking layer side toward the p-type contact layer side, and the reduction rate of the Al content z of the p-type cladding layer in the thickness direction is 0.01/nm or more and 0.025/nm or less.

(2) The III nitride semiconductor light-emitting device according to (1) above, wherein change in the Al content z of the p-type cladding layer from the interface between the p-type cladding layer and the electron blocking layer to the interface between the p-type cladding layer and the p-type contact layer is (x−y)/2 or more.

(3) The III nitride semiconductor light-emitting device according to (1) or (2) above, wherein the Al content z of the p-type cladding layer gradually decreases from the Al content x of the electron blocking layer or less.

(4) The III nitride semiconductor light-emitting device according to any one of (1) to (3) above, wherein the Al content z of the p-type cladding layer gradually decreases down to the Al content y of the p-type contact layer or more.

(5) The III nitride semiconductor light-emitting device according to any one of (1) to (4) above, wherein light emitted from the light emitting layer is deep ultraviolet light having a center wavelength of 320 nm or less.

(6) A method of producing a III nitride semiconductor light-emitting device including an n-type semiconductor layer; a light emitting layer containing at least Al; and a p-type semiconductor layer in this order, wherein a step of forming the p-type semiconductor layer comprises:

an electron blocking layer formation step for forming an electron blocking layer made of $Al_xGa_{1-x}N$ ($0.55 \leq x \leq 1.0$) on the light emitting layer;

a p-type cladding layer formation step for forming a p-type cladding layer made of $Al_zGa_{1-z}N$ on the electron blocking layer; and a p-type contact layer formation step for forming a p-type contact layer made of $Al_yGa_{1-y}N$ ($0 \leq y \leq 0.1$) on the p-type cladding layer, the Al content z of the p-type cladding layer is gradually reduced over the whole thickness of the p-type cladding layer from the electron blocking layer side toward the p-type contact layer side, and the reduction rate of the Al content z of the p-type cladding layer in the thickness direction is 0.01/nm or more and 0.025/nm or less.

In this disclosure, the Al content of a p-type cladding layer is gradually reduced over the whole thickness of the p-type cladding layer from the electron blocking layer side toward the p-type contact layer side and the rate of reduction of the Al content z of the p-type cladding layer in the thickness direction is 0.01/nm or more and 0.025/nm or less. Thus, a long-life III nitride semiconductor light-emitting device can be obtained.

DETAILED DESCRIPTION

Embodiments of this disclosure will now be described with reference to the drawings. In principle, the same components are denoted by the same reference numeral, and the description will not be repeated. Further, for the sake of description, the heights of the sapphire substrate and the layers in the diagrams are increased with respect to the widths thereof; accordingly, the ratios between the heights and widths do not conform to the actual ratios. Note that the value of the Al content of each layer can be measured for example using energy-dispersive X-ray spectroscopy (EDS). When a sufficiently large thickness is secured, scanning electron microscope (SEM)-EDS can be used, whereas when the thickness of the layers is small as in the case of well layers or a superlattice laminate, the measurement can be performed using transmission electron microscope (TEM)-EDS.

(III Nitride Semiconductor Light-Emitting Device)

A III nitride semiconductor light-emitting device in accordance with an embodiment of this disclosure includes a light emitting layer having a quantum well structure, including an-type semiconductor layer, a well layer containing at least Al, and a barrier layer; and a p-type semiconductor layer in which an electron blocking layer, a p-type cladding layer, and a p-type contact layer are sequentially stacked, in this order. The Al content x of the electron blocking layer is $0.55 \leq x \leq 1.0$, and the Al content y of the p-type contact layer is $0 \leq y \leq 0.1$. Here, it is important that the Al content z of the p-type cladding layer gradually decreases over the whole thickness of the p-type cladding layer from the electron blocking layer side toward the p-type contact layer side, and the reduction rate of the Al content z of the p-type cladding layer in the thickness direction is 0.01/nm or more and 0.025/nm or less.

Figure 1:
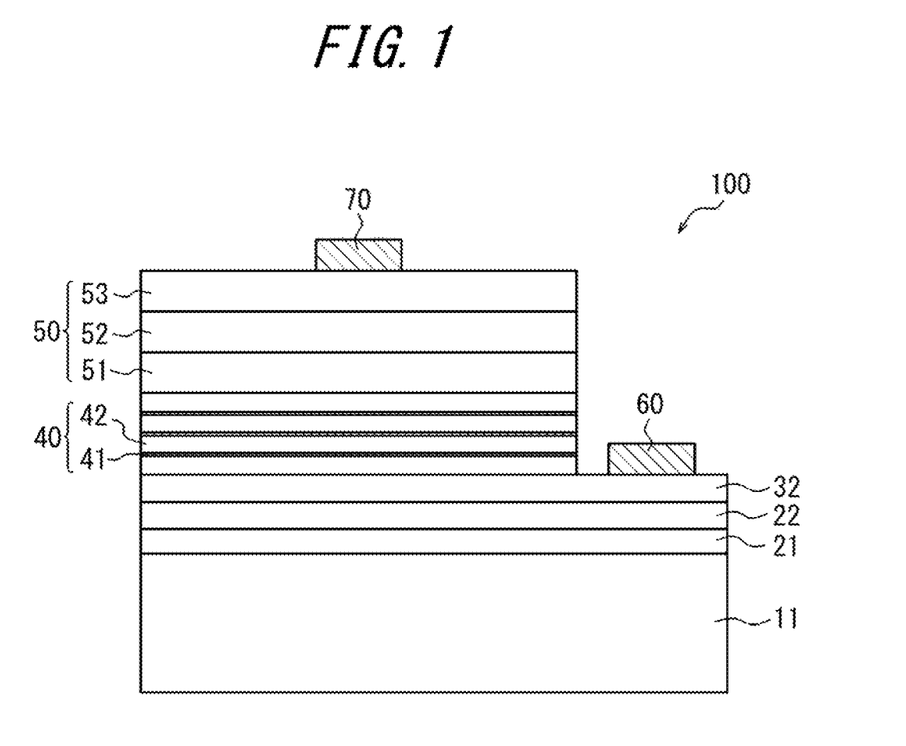
FIG. 1 is a schematic cross-sectional view of a III nitride semiconductor light-emitting device of Conventional Example.

FIG. 1 is a schematic cross-sectional view of a III nitride semiconductor light-emitting device of Conventional Example. In the III nitride semiconductor light-emitting device 100 shown in the diagram, an AlN layer 21, an undoped layer 22, an n-type semiconductor layer 32, and a light emitting layer 40 are stacked in this order on a sapphire substrate 11. On the light emitting layer 40, a p-type semiconductor layer 50 in which an electron blocking layer 51, a p-type cladding layer 52, and a p-type contact layer 53 are sequentially stacked is formed. Further, the light emitting layer 40 and the p-type semiconductor layer 50 are partially removed by etching or the like, and an n-type electrode 60 is formed on the exposed n-type semiconductor layer 32 and a p-type electrode 70 is formed on the p-type contact layer 53.

In attempts to improve the life of a semiconductor light-emitting device compared with a conventional device, the inventor noted the p-type semiconductor layer 50 of the light-emitting device 100 of Conventional Example shown in FIG. 1. The p-type semiconductor layer 50 has a structure in which the electron blocking layer 51, the p-type cladding layer 52, and the p-type contact layer 53 are sequentially stacked as described above. The inventor tried gradually reducing the Al content of the p-type cladding layer 52 from the electron blocking layer 51 side toward the p-type contact layer 53 side to gradually reduce the Al content of the p-type cladding layer 52. As a result, the light-emitting device was found to have a significantly longer life with a light output power as high as that achieved with a conventional device being realized.

However, as a result of further studies made by the inventor, it was found that the life of a device would be shorter than conventional devices depending on the mode of change in the Al content or the degree of the gradation of the Al content (that is, the reduction rate of the Al content in the thickness direction) of the p-type cladding layer 52. Given this situation, he diligently studied the conditions for realizing a long-life III nitride semiconductor light-emitting device to find that it is significantly beneficial to gradually reduce the Al content z of the p-type cladding layer 52 over the whole thickness of the p-type cladding layer 52 from the electron blocking layer 51 side toward the p-type contact layer 53 side and to control the reduction rate of the Al content z of the p-type cladding layer 52 in the thickness direction to 0.01/nm or more and 0.025/nm or less. This disclosure is based on the findings of the studies.

As described above, the formation of the p-type semiconductor layer 50 provided on the light emitting layer 40 is a feature of this disclosure and any structure other than the structure of the p-type semiconductor layer 50 is not limited in particular. Features of a III nitride semiconductor light-emitting device in accordance with a preferred embodiment will now be described.

Figure 2:
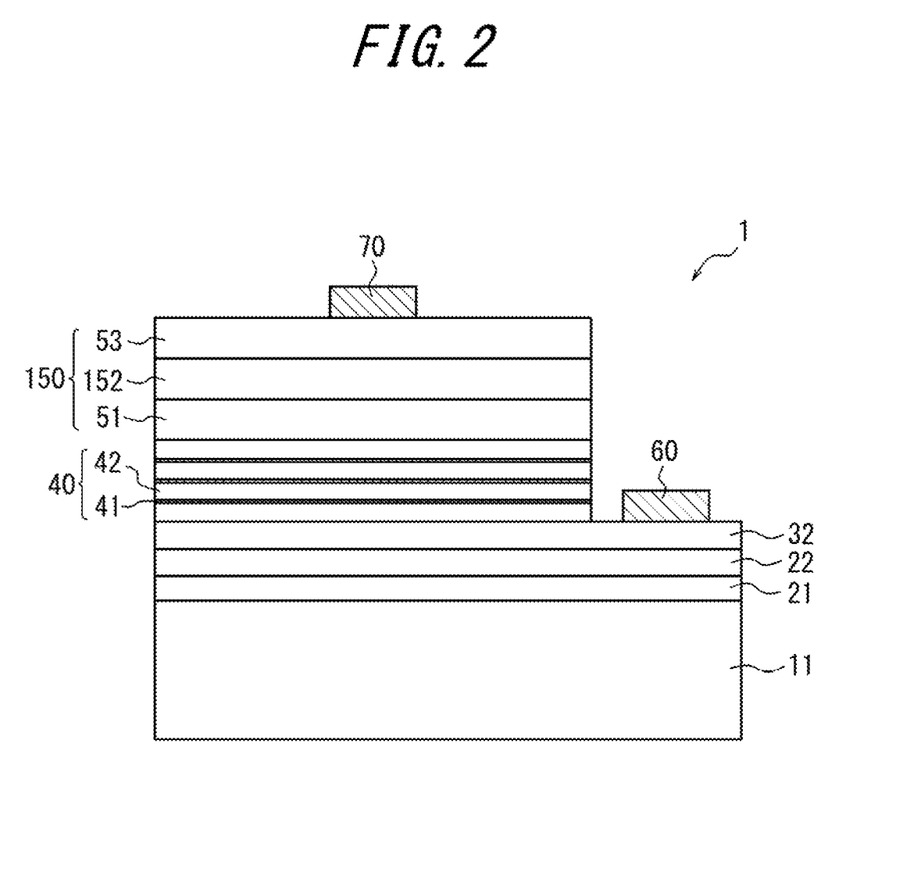
FIG. 2 is a schematic cross-sectional view of a III nitride semiconductor light-emitting device in accordance with a preferred embodiment.

FIG. 2 shows a III nitride semiconductor light-emitting device in accordance with a preferred embodiment. In the III nitride semiconductor light-emitting device 1 shown in the diagram, an AlN layer 21, an undoped layer 22, an n-type semiconductor layer 32, and a light emitting layer 40 are stacked in this order on a sapphire substrate 11. On the light emitting layer 40, a p-type semiconductor layer 150 in which an electron blocking layer 51, a p-type cladding layer 152, and a p-type contact layer 53 are sequentially stacked is formed. Further, the light emitting layer 40 and the p-type semiconductor layer 150 are partially removed by etching or the like, and an n-type electrode 60 is formed on the exposed n-type semiconductor layer 32 and a p-type electrode 70 is formed on the p-type contact layer 53.

The sapphire substrate 11 supports a III nitride semiconductor layer composed of the n-type semiconductor layer 32, the light emitting layer 40, and the p-type semiconductor layer 150. A main surface 11A of the sapphire substrate 11 can have an off-angle θ as appropriate. When an off-angle θ is provided, the crystallographic orientation in the inclination direction may be either in the m axis direction or in the a axis direction; for example, the C plane may be inclined at an off-angle of 0.5° as described in Japanese Patent Application No. 2014-224637.

The AlN layer 21 serves as a buffer layer which relaxes the lattice strain due to lattice mismatch between the sapphire substrate 11 and the III nitride semiconductor layer composed of the n-type semiconductor layer 32, the light emitting layer 40, and the p-type semiconductor layer 50, thereby improving the crystallinity of the III nitride semiconductor layer. The AlN layer 21 and the sapphire substrate 11 are collectively referred to as an "AlN template substrate".

The undoped layer 22 and the n-type semiconductor layer 32 are layers provided in order to further improve the crystallinity of the III nitride semiconductor layer composed of the n-type semiconductor layer 32, the light emitting layer 40, and the p-type semiconductor layer 50.

The light emitting layer 40 is a layer that emits light by the recombination of holes and electrons having been injected, which layer contains at least Al, and for example, can be formed from an $Al_aGa_{1-a}N$ material ($0<a\leq1$). Here, the Al content is suitably set so that light having the desired wavelength is emitted. When the Al content a is 0.23 or more, the center wavelength of the light emitted from the light emitting layer 40 is 320 nm or less. The disclosed technique is useful for such a light-emitting device having a center wavelength of 320 nm or less, in particular, for a light-emitting device having an Al content a of 0.35 or more or a center wavelength of 300 nm or less. The III nitride semiconductor light-emitting device 1 to be ultimately obtained is a DUV-LED.

This light emitting layer 40 can have a multiple quantum well (MQW) structure in which well layers 41 and barrier layers 42 made of AlGaN having different Al contents are repeatedly formed. The Al content of the well layers 41 is, for example, 0.3 to 0.8. The Al content of the barrier layers 42 is higher than the Al content of the well layers 41, for example, 0.40 to 0.95. Further, the number of repetitions of the well layers 41 and barrier layers 42 is, for example, 1 to 10. The thickness of the well layers 41 is 0.5 nm to 5 nm, whereas the thickness of the barrier layers 42 is 3 nm to 30 nm.

The p-type semiconductor layer 150 has a structure in which the electron blocking layer 51, the p-type cladding layer 152, and the p-type contact layer 53 are sequentially stacked. The electron blocking layer 51 is typically a layer provided between the light emitting layer and the p-type cladding layer to stop electrons and inject the electrons into the light emitting layer 40 (well layers 41 in the case of the MQW) thereby improving the injection efficiency of the electrons. In particular, when the Al content of the light emitting layer 40 is high, the hole concentration of the p-type semiconductor layer is low, which makes it difficult to inject holes into the light emitting layer 40, and the electrons would partly flow to the p-type semiconductor layer side. However, the provision of the electron blocking layer 51 allows such a flow of electrons to be avoided. Note that the "electron blocking layer" herein means a layer having an Al content z that is higher than the Al content of the barrier layers 42 constituting part of the light emitting layer 40, and having a large band gap.

The electron blocking layer 51 is formed from a p-type $Al_xGa_{1-x}N$ material, and the Al content x thereof satisfies $0.55 \leq x \leq 1.0$. Such a structure can increase the injection efficiency of electrons into the well layers 41. Further, the thickness of the electron blocking layer 51 is preferably, for example, 6 nm to 60 nm. When the thickness of the electron blocking layer 51 is either smaller than 6 nm or larger than 60 nm, the output is significantly reduced.

A dopant used to impart p-type conductivity to the electron blocking layer 51 may be magnesium (Mg) or zinc (Zn). For the Mg source, bis(cyclopentadienyl)magnesium ($CP_2Mg$) can be used, and for the Zn source, zinc chloride ($ZnCl_2$) can be used. A dopant used to impart n-type conductivity to the electron blocking layer 51 may be Si. For the Si source, silane ($SiH_4$) or tetraethylsilane ($(C_2H_5)_4Si$) or the like can be used.

In this disclosure, the p-type cladding layer 152 is provided between the electron blocking layer 51 and the p-type contact layer 53 to divide the band offset between the p-type contact layer 53 and the electron blocking layer 51, help the injection of holes into the light emitting layer, and increase the injection efficiency of the holes. The p-type cladding layer 152 is formed from a p-type $Al_zGa_{1-z}N$ material, and the Al content z thereof is gradually reduced over the whole thickness of the p-type cladding layer 152 from the electron blocking layer 51 side toward the p-type contact layer 53 side. Gradually reducing the Al content z of the p-type cladding layer 152 makes it possible to increase the hole concentration due to the polarization doping effect, thereby significantly improving the life of the device while maintaining high light output power.

Here, "gradually reducing the Al content of the p-type cladding layer 152 over the whole thickness of the p-type cladding layer 152" means that the Al content z of the p-type cladding layer 152 is continuously reduced from the interface of the p-type cladding layer 152 with the electron blocking layer 51 toward the interface thereof with the p-type contact layer 53. The continuous reduction requires that the profile of the Al content reduced continuously or in a stepwise manner over the total thickness of the p-type cladding layer 152 has less steps as a whole with no more than 20%, preferably no more than 10% of the profile being flat. This excludes a case where the Al content z is gradually reduced from the interface with the electron blocking layer 51 over a certain thickness and is constant over a thickness exceeding 20% of the total thickness of the p-type cladding layer 152 to the interface with the p-type contact layer 53 and a case where the Al content z is constant over a thickness exceeding 20% of the total thickness of the p-type cladding layer 152 from the interface with the electron blocking layer 51 and is gradually reduced to the interface with the p-type contact layer 53.

The change in the Al content z of the p-type cladding layer 152 from the interface between the p-type cladding layer 152 and the electron blocking layer 51 to the interface between the p-type cladding layer 152 and the p-type contact layer 53 is preferably at least half of the difference of the Al content between the electron blocking layer 51 and the p-type contact layer 53, i.e., $(x-y)/2$ or more. The change in the Al content z is, for example, in the range of 0.225 or more and 1.0 or less. With less than half the difference of the Al content between the electron blocking layer 51 and the p-type contact layer 53, the effect in improving the life of a device is not sufficiently achieved.

Note that it is difficult to determine the numeric value of the Al content at the interface between the p-type cladding layer 152 and the electron blocking layer 51 and the Al content at the interface between the p-type cladding layer 152 and the p-type contact layer 53; accordingly, the values of the positions 2 nm inside the p-type cladding layer 152 from the interfaces are used instead.

The gradual reduction of the Al content of the p-type cladding layer 152 is preferably starts from at least the Al content x of the electron blocking layer 51, more preferably from the exact Al content x of the electron blocking layer 51. Thus, the band offset between the electron blocking layer 51 and the p-type cladding layer 152 is eliminated, thereby improving the life of the device by effectively using the polarization doping effect.

Further, the value of the Al content at which the gradual reduction of the Al content z of the p-type cladding layer 152 is terminated is preferably equal to or more than the Al content y of the p-type contact layer 53, more preferably the same as the value of the Al content y. In other words, the Al content z of the p-type cladding layer 152 is preferably in the range of $y \leq z \leq x$. Most preferably, the Al content z gradually decreases from x toward y. This eliminates the band offset between the p-type cladding layer and the p-type contact layer 53 and increases the hole injection efficiency, thereby improving the life of the device.

Further, when the Al content z of the p-type cladding layer 152 is gradually reduced from the interface with the electron blocking layer 51 to the interface with the p-type contact layer 53, the reduction rate of the Al content z in the thickness direction of the of the p-type cladding layer 152 is 0.01/nm or more and 0.025/nm or less. Here, when the reduction rate of the Al content z in the thickness direction is either less than 0.01/nm or more than 0.025/nm, the light output tends to be low and the life tends to be shortened.

More preferably, the reduction rate is 0.012/nm or more and 0.02/nm or less. The reduction rate is preferably 0.01/nm or more and 0.02/nm or less, more preferably, 0.01/nm or more and 0.014/nm or less.

Here, the reduction rate of the Al content z in the thickness direction should satisfy the above range at a given position in the thickness direction of the p-type cladding layer 152.

Thus, in this disclosure, the Al content z of the p-type cladding layer 152 is gradually reduced over the whole thickness of the p-type cladding layer 152 from the electron blocking layer 51 side toward the p-type contact layer 53 side, and the reduction rate of the Al content z of the p-type cladding layer 152 in the thickness direction is 0.01/nm or more and 0.025/nm or less. As long as those requirements are satisfied, the way of reducing the Al content z is not limited. For example, the reduction can be performed linearly or curvilinearly. Alternatively, the reduction can be performed in a stepwise manner when the difference in the Al content for one step is 0.15 or less.

The thickness of the p-type cladding layer 152 is preferably larger than the thickness of the barrier layer and is 14 nm or more and 100 nm or less. In particular, the thickness is preferably 28 nm or more and 70 nm or less. This can improve the light output power and the life of the device. The thickness of the p-type cladding layer 152 is suitably set in accordance with the reduction rate of the Al content z of the p-type cladding layer 152 in the thickness direction, and in accordance with the difference of the Al content between the electron blocking layer 51 and the p-type contact layer 53.

A dopant used to impart p-type conductivity to the p-type cladding layer 152 may be Mg or Zn as in the case of the electron blocking layer 51. Likewise, for the Mg source, $CP_2Mg$ can be used, and for the Zn source, $ZnCl_2$ can be used.

The p-type contact layer 53 is formed from a p-type $Al_yGa_{1-y}N$ material. The p-type contact layer 53 is a layer for reducing the contact resistance between the p-type electrode 70 to be formed thereon and the electron blocking layer 51. In this regard, the Al content y of the p-type contact layer 53 should satisfy $0 \leq y \leq 0.1$. This can sufficiently reduce the contact resistance between the electron blocking layer 51 and the p-type electrode 70 formed on the p-type contact layer 53. In particular, the Al content y preferably satisfies y=0.

A dopant used to impart p-type conductivity to the p-type contact layer 53 may be Mg or Zn as in the case of the electron blocking layer 51. Likewise, for the Mg source, $CP_2Mg$ can be used, and for the Zn source, $ZnCl_2$ can be used.

The n-type electrode 60 is provided on the n-type semiconductor layer 32 exposed by partially removing the light emitting layer 40 and the p-type semiconductor layer 150 by etching or the like. The n-type electrode 60 can be formed, for example, as a metal composite film having a Ti-containing film and an Al-containing film formed on the Ti-containing film. The thickness, shape, and size of each of these films of the n-type electrode can be selected as appropriate in accordance with the shape and the size of the light-emitting device.

The p-type electrode 70 is formed on the p-type contact layer 53. The p-type electrode 70 can be formed, for example, as a metal composite film having a Ni-containing film and a Au-containing film formed on the Ni-containing film. The thickness, shape, and size of these films of the p-type electrode can be selected as appropriate in accordance with the shape and the size of the light-emitting device.

Thus, the disclosed III nitride semiconductor light-emitting device has a long life.

(Method of Producing III Nitride Semiconductor Light-Emitting Device)

Figure 3:
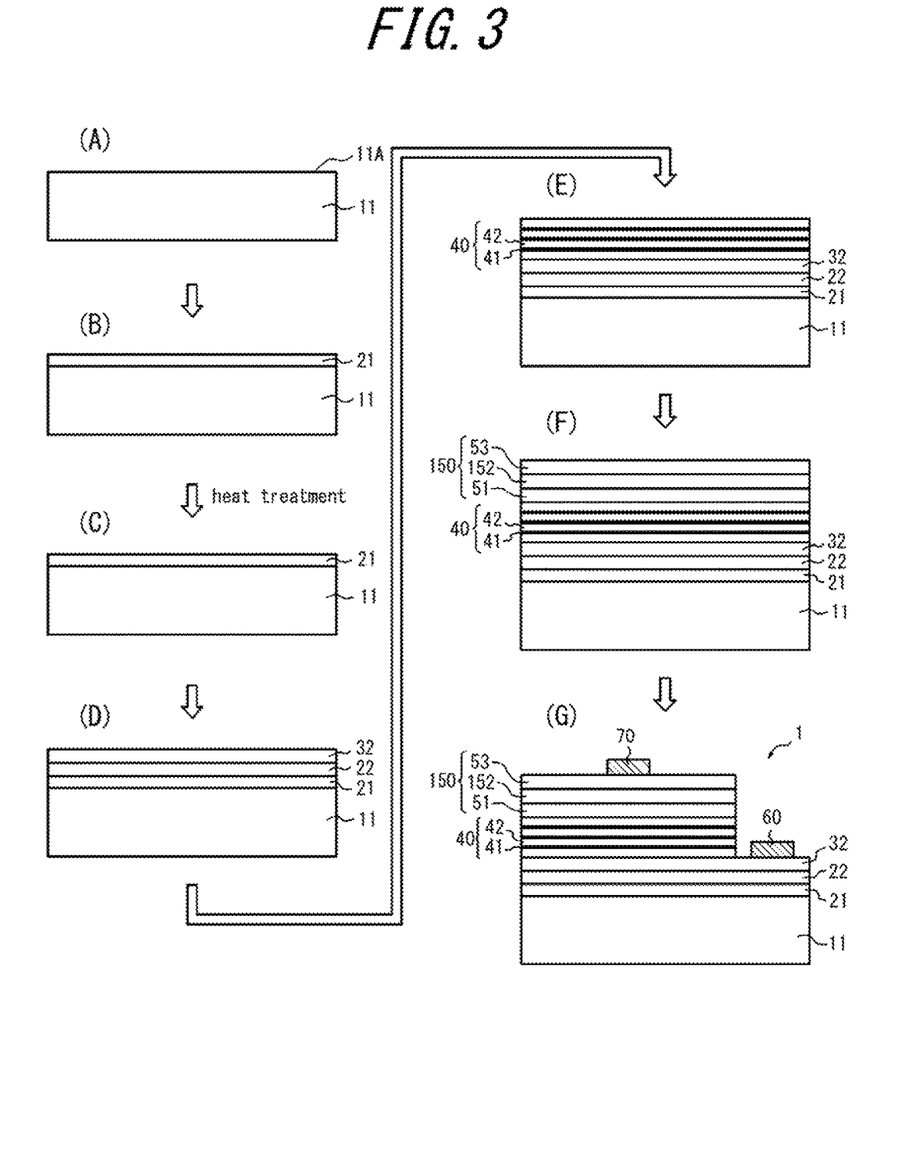
FIG. 3 is a flowchart of a method of producing a III nitride semiconductor light-emitting device in accordance with a preferred embodiment.

Next, a method of producing a III nitride semiconductor light-emitting device in accordance with this disclosure will now be described. FIG. 3 shows a flowchart of a method of producing a III nitride semiconductor light-emitting device in accordance with a preferred embodiment. First, as shown in FIG. 3(A), a sapphire substrate 11 is prepared. As described above, the main surface 11A of the sapphire substrate 11 may or may not have an off-angle θ, and the C plane may be inclined at an off-angle of 0.5°.

Next, as shown in FIG. 3(B), the AlN layer 21 is epitaxially grown on the sapphire substrate 11. The AlN layer 21 can be formed by a known thin film deposition technique, for example, by metalorganic chemical vapor deposition (MOCVD), molecular beam epitaxy (MBE), or sputtering.

For the Al source for the AlN layer 21, trimethylaluminum (TMA) can be used. Further, for the N source, ammonia ($NH_3$) gas can be used. Those source gases are used with hydrogen gas as a carrier gas to form the AlN layer 21.

Note that the growth temperature of the AlN layer 21 is preferably 1270° C. or more and 1350° C. or less, more preferably 1290° C. or more and 1330° C. or less. With this temperature range, the crystallinity of the AlN layer 21 can be improved after the subsequent heat treatment. Further, the growth pressure in the chamber can be, for example, 5 Torr to 20 Torr. More preferably, the growth pressure is 8 Torr to 15 Torr.

Further, the molar ratio of a V element gas such as $NH_3$ gas to a III element gas such as TMA gas, calculated based on the growth gas flow rate of the V element gas and the III element gas (hereinafter referred to as V/III ratio) can be, for example, 130 or more and 190 or less. More preferably, the V/III ratio is 140 or more and 180 or less. Note that since the growth temperature and the growth pressure determine the optimum V/III ratio, the growth gas flow rate is preferably determined appropriately.

Subsequently, the AlN layer 21 on the sapphire substrate 11, obtained as described above is preferably subjected to a heat treatment at a temperature higher than the growth temperature of the AlN layer 21. The heat treatment process can be performed using a known heat treatment furnace. Performing the heat treatment makes the half width of the X-ray rocking curve of the (10-12) plane of the AlN layer 21 be 400 s or less, thereby realizing high crystallinity (FIG. 3(C)).

After that, as shown in FIG. 3(D), a layered structure having the undoped layer 22 and the n-type semiconductor layer 32 in this order is formed on the AlN layer 21.

Next, as shown in FIG. 3(E), the light emitting layer 40 is formed. As described above, the light emitting layer 40 contains at least Al, and can be formed from, for example, an $Al_aGa_{1-a}N$ material ($0 < a \leq 1$); when the Al content a is 0.35 or more, the center wavelength of light emitted from the light emitting layer 40 is 300 nm or less; and the III nitride semiconductor light-emitting device 1 to be ultimately obtained is a DUV-LED. Likewise, the light emitting layer 40 may have a MQW structure in which the well layers 41 and the barrier layers 42 made of AlGaN having different Al contents are repeatedly formed as described above.

When the light emitting layer 40 is formed from an AlGaN material, for the Al source, TMA can be used; for the Ga source, trimethylgallium (TMG); and for the N source, NH$_3$ gas. Those source gases are supplied into a chamber using hydrogen gas as a carrier gas, thereby forming the light emitting layer 40. When the light emitting layer 40 has a MQW structure, the ratio between the flow rate of the Al source and the flow rate of the Ga source is suitably changed, thereby forming the light emitting layer 40 having a MQW structure.

When the light emitting layer 40 is formed from an Al$_a$Ga$_{1-a}$N material (0<a≤1), the growth temperature of the Al$_a$Ga$_{1-a}$N material is preferably 1000° C. or more and 1400° C. or less, more preferably 1050° C. or more and 1350° C. or less.

Further, the molar ratio of a V element gas such as NH$_3$ gas to a III element gas such as TMA gas, calculated based on the growth gas flow rate of the V element gas and the III element gas (hereinafter referred to as V/III ratio) can be, for example, 100 or more and 100000 or less. More preferably, the V/III ratio is 300 or more and 30000 or less. Since the growth temperature and the growth pressure determine the optimum V/III ratio, the growth gas flow rate is preferably determined appropriately as in the case of the AlN layer 21.

Subsequently, as shown in FIG. 3(F), the p-type semiconductor layer 150 is formed on the light emitting layer 40. As described above, the p-type semiconductor layer 150 has a structure in which the electron blocking layer 51, the p-type cladding layer 152, and the p-type contact layer 53 are sequentially stacked.

The electron blocking layer 51 is formed from a p-type Al$_x$Ga$_{1-x}$N material, and the Al content x thereof satisfies 0.55≤x≤1.0. Further, the thickness of the electron blocking layer 51 is preferably, for example, 6 nm to 60 nm as described above.

A dopant used to impart p-type conductivity to the electron blocking layer 51 may be Mg or Zn. For the Mg source, CP$_2$Mg can be used, and for the Zn source, ZnCl$_2$ can be used.

The electron blocking layer 51 can be formed by supplying TMA, TMG, and NH$_3$ gas, which are source gases, and for example CP$_2$Mg, which is an impurity gas, into a chamber using, as a carrier gas, a gas mainly containing hydrogen.

The growth temperature of the Al$_x$Ga$_{1-x}$N material forming the electron blocking layer 51 is preferably 1000° C. or more and 1400° C. or less, more preferably 1050° C. or more and 1350° C. or less. Further, the growth pressure in the chamber can be, for example, 10 Torr to 760 Torr. More preferably, the growth pressure is 20 Torr to 380 Torr.

Further, the molar ratio of a V element gas such as NH$_3$ gas to a III element gas such as TMA gas, calculated based on the growth gas flow rate of the V element gas and the III element gas (hereinafter referred to as V/III ratio) can be, for example, 100 or more and 100000 or less. More preferably, the V/III ratio is 300 or more and 30000 or less. Since the growth temperature and the growth pressure determine the optimum V/III ratio, the growth gas flow rate is preferably determined appropriately as in the case of the AlN layer 21.

The p-type cladding layer 152 is formed from a p-type Al$_z$Ga$_{1-z}$N material and the Al content z thereof is gradually reduced over the whole thickness of the p-type cladding layer 152 from the electron blocking layer 51 side toward the p-type contact layer 53 side, and the reduction rate of the Al content z in the thickness direction is 0.01/nm or more and 0.025/nm or less. The thickness of the p-type cladding layer 152 is preferably, for example, 14 nm or more and 90 nm or less, and particularly preferably 28 nm or more and 70 nm or less as described above.

For a dopant used to impart p-type conductivity to the p-type cladding layer 152 may be Mg or Zn as in the case of the electron blocking layer 51. Likewise, for the Mg source, CP$_2$Mg can be used, and for the Zn source, ZnCl$_2$ can be used.

The p-type cladding layer 152 can be formed by supplying TMA, TMG, and NH$_3$ gas, which are source gases, and for example CP$_2$Mg, which is an impurity gas, into a chamber using, as a carrier gas, a gas mainly containing hydrogen.

Here, the gradual reduction of the Al content z of the p-type cladding layer 152 can be performed particularly by gradually reducing the flow rate of the supplied TMA. On that occasion, the gradual reduction can be performed by continuously changing the TMG flow rate, the CP$_2$Mg flow rate, the NH$_3$ flow rate, the growth pressure, or the growth temperature from the values for the electron blocking layer 51 to the values for the p-type contact layer 53.

The growth temperature of the Al$_z$Ga$_{1-z}$N material forming the p-type cladding layer 152 is preferably 1000° C. or more and 1400° C. or less, more preferably 1050° C. or more and 1350° C. or less. Further, the growth pressure in the chamber can be, for example, 10 Torr to 760 Torr. More preferably, the growth pressure is 20 Torr to 380 Torr.

Further, the molar ratio of a V element gas such as NH$_3$ gas to a III element gas such as TMA gas, calculated based on the growth gas flow rate of the V element gas and the III element gas (hereinafter referred to as V/III ratio) can be, for example, 100 or more and 100000 or less. More preferably, the V/III ratio is 300 or more and 30000 or less. Since the growth temperature and the growth pressure determine the optimum V/III ratio, the growth gas flow rate is preferably determined appropriately as in the case of the AlN layer 21.

Subsequently, the p-type contact layer 53 is formed on the p-type cladding layer 152. The p-type contact layer 53 is formed from a p-type Al$_y$Ga$_{1-y}$N material and the Al content y satisfies 0≤y≤0.1. Here, the Al content y preferably satisfies y=0 as described above.

A dopant used to impart p-type conductivity to the p-type contact layer 53 may be Mg or Zn as in the case of the electron blocking layer 51. Likewise, for the Mg source, CP$_2$Mg can be used, and for the Zn source, ZnCl$_2$ can be used.

The growth temperature of the p-type contact layer 53 is preferably 800° C. or more and 1400° C. or less, more preferably 900° C. or more and 1300° C. or less. Further, the growth pressure in the chamber can be, for example, 10 Torr to 760 Torr. More preferably, the growth pressure is 20 Torr to 600 Torr.

Further, the molar ratio of a V element gas such as NH$_3$ gas to a III element gas such as TMA gas, calculated based on the growth gas flow rate of the V element gas and the III element gas (hereinafter referred to as V/III ratio) can be, for example, 100 or more and 100000 or less. More preferably, the V/III ratio is 300 or more and 30000 or less. Since the growth temperature and the growth pressure determine the optimum V/III ratio, the growth gas flow rate is preferably determined appropriately as in the case of the AlN layer 21.

Lastly, as shown in FIG. 3(G), the light emitting layer 40 and the p-type semiconductor layer 150 are partially removed by etching or the like; the n-type electrode 60 is formed on the exposed n-type semiconductor layer 32, and the p-type electrode 70 is formed on the p-type contact layer 53. As described above, the n-type electrode 60 can be formed, for example, as a metal composite film having a Ti-containing film and an Al-containing film formed on the Ti-containing film. The thickness, shape, and size of each of these films of the n-type electrode can be selected as appropriate in accordance with the shape and the size of the light-emitting device.

Further, as described above, the p-type electrode 70 can be formed, for example, as a metal composite film having a Ni-containing film and a Au-containing film formed on the Ni-containing film. The thickness, shape, and size of these films of the p-type electrode can be selected as appropriate in accordance with the shape and the size of the light-emitting device.

Thus, a III nitride semiconductor light-emitting device having a long life can be produced.

EXAMPLES

Example 1

This disclosure will now be described in more detail using examples. However, this disclosure is not limited to the following examples. A III nitride semiconductor light-emitting device was fabricated in accordance with the flowchart shown in FIG. 3. First, a sapphire substrate (diameter: 2 in, thickness: 430 μm, plane direction: (0001), off-angle θ in m axis direction: 0.5°, terrace width: 100 nm, step highest: 0.20 nm) was prepared (FIG. 3(A)). Next, an AlN layer having a center thickness of 0.60 μm (average thickness: 0.61 μm) was grown by MOCVD on the above sapphire substrate to obtain an AlN template substrate (FIG. 3(B)). On that occasion, the growth temperature of the AlN layer was 1300° C., the growth pressure in the chamber was 10 Torr, and the growth gas flow rate of ammonia gas and TMA gas was set so that the V/III ratio was 163. The flow rate of the V element gas ($NH_3$) was 200 sccm, and the flow rate of the III element gas (TMA) was 53 sccm. Note that for the thickness of the AlN layer, the thicknesses of total 25 portions distributed at regular intervals, including the center of the wafer plane were measured using an interference thickness measurement system (Nanospec M6100A manufactured by Nanometrics Incorporated).

Next, the AlN template substrate was introduced into a heat treatment furnace. After the pressure of the furnace was reduced to 10 Pa, the furnace was purged with nitrogen gas to achieve a nitrogen gas atmosphere in the furnace, followed by raising the temperature inside the furnace, thus performing heat treatment on the AlN template substrate (FIG. 3(C)). The heat treatment was performed at a heating temperature of 1650° C. for a heating time of four hours.

Subsequently, a layer made of $Al_{0.7}Ga_{0.3}N$ with a thickness of 1 μm was formed as an undoped layer by MOCVD. Next, on the undoped layer, a layer made of $Al_{0.62}Ga_{0.38}N$, doped with Si with a thickness of 2 μm was formed as an n-type semiconductor layer (FIG. 3(D)). Note that according to a result of SIMS analysis, the Si concentration of the n-type semiconductor layer was $1.0 \times 10^{19}$ atoms/$cm^3$.

Next, on the n-type semiconductor layer, well layers made of $Al_{0.45}Ga_{0.55}N$ with a thickness of 3 nm and barrier layers made of $Al_{0.65}Ga_{0.35}N$ with a thickness of 7 nm were alternately and repeatedly stacked thereby forming a light emitting layer having 3.5 pairs of the layers (FIG. 3(E)). Of 3.5 pairs, 0.5 pair indicates that the first and the last layers in the light emitting layer were barrier layers.

On the light emitting layer, an electron blocking layer made of $Al_{0.7}Ga_{0.3}N$, doped with Mg with a thickness of 40 nm was then formed using hydrogen gas as a carrier gas. Next, a p-type cladding layer made of an AlGaN material, doped with Mg with a thickness of 50 nm was formed using hydrogen gas as a carrier gas. On that occasion, while maintaining the flow rate of TMG at 23 sccm, the flow rate of TMA was continuously changed linearly from 150 sccm to 0 sccm so that the Al content z of the p-type cladding layer would gradually decrease over the whole thickness of the p-type cladding layer from the electron blocking layer side toward the p-type contact layer side. Further, the flow rates of the hydrogen gas used as a carrier gas, $NH_3$ gas, and $Cp_2Mg$ were 30 slm, 30 slm, and 1000 sccm, respectively. After the growth under such conditions, the reduction rate of the Al content of the p-type cladding layer in the thickness direction was 0.014/nm. Subsequently, a p-type contact layer made of GaN, doped with Mg with a thickness of 180 nm was formed using hydrogen gas as a carrier gas. On that occasion, the growth pressure inside the chamber was 300 mbar. Further, the flow rates of the hydrogen gas used as a carrier gas, $NH_3$ gas, TMG, and $Cp_2Mg$ were 30 slm, 30 slm, 150 slm, and 1000 sccm, respectively. Note that the flow rate of the TMG gas was reduced to increase the probability of the presence of Mg in a region of the p-type contact layer with a thickness of 30 nm of the total thickness of 180 nm, the region being in contact with the electrode, and the growth rate was reduced, thereby obtaining a layer having a high Mg concentration. After that, a mask was formed on the p-type contact layer, and mesa etching was performed by dry etching to expose the n-type semiconductor layer. Next, a p-type electrode made of Ni/Au was formed on the p-type contact layer, and an n-type electrode made of Ti/Al was formed on the exposed n-type semiconductor layer. Note that the p-type electrode had Ni having a thickness of 50 angstrom and Au having a thickness of 1500 angstrom. Further, the n-type electrode had Ti having a thickness of 200 angstrom and Al having a thickness of 1500 angstrom. Lastly, contact annealing (RTA) was performed at 550° C. to form an electrode. Thus, a III nitride semiconductor light-emitting device in accordance with this disclosure was fabricated.

Example 2

A nitride semiconductor light-emitting device in accordance with Example 2 was fabricated under entirely the same conditions as Example 1 except that the thickness of the p-type cladding layer was 25 nm and the Al content of the p-type cladding layer was not reduced to 0, i.e., the Al content of the p-type contact layer, but gradually reduced to 0.35. Note that the reduction rate of the Al content of the p-type cladding layer in the thickness direction was 0.014/nm.

Conventional Example

A nitride semiconductor light-emitting device in accordance with Conventional Example was fabricated under entirely the same conditions as Example 1 except that the Al content of the p-type cladding layer was fixed at 0.35 in the thickness direction.

Comparative Example 1

A nitride semiconductor light-emitting device in accordance with Comparative Example 1 was fabricated under entirely the same conditions as Example 1 except for the following conditions. The thickness of the electron blocking layer was 20 nm and the p-type cladding layer had a two-layer structure including a first p-type cladding layer with a thickness of 20 nm formed directly on the electron blocking layer and a second p-type cladding layer with a thickness of 50 nm formed immediately on the first p-type cladding layer. Here, the Al content of the first p-type cladding layer was fixed at 0.5, and the Al content of the second p-type cladding layer was fixed at 0.35.

Comparative Example 2

A nitride semiconductor light-emitting device in accordance with Comparative Example 2 was fabricated under entirely the same conditions as Example 1 except that the thickness of the p-type cladding layer was 25 nm. Note that the reduction rate of the Al content of the p-type cladding layer in the thickness direction was 0.028/nm.

Comparative Example 3

A nitride semiconductor light-emitting device in accordance with Comparative Example 3 was fabricated under entirely the same conditions as Example 1 except that the Al content of the p-type cladding layer was not reduced to 0, i.e., the Al content of the p-type contact layer, but gradually reduced to 0.35. Note that the reduction rate of the Al content of the p-type cladding layer in the thickness direction was 0.007/nm.

Comparative Example 4

A nitride semiconductor light-emitting device in accordance with Comparative Example 4 was fabricated under entirely the same conditions as Example 1 except for the following conditions. The p-type cladding layer had a two-layer structure including a first p-type cladding layer with a thickness of 25 nm formed immediately on the electron blocking layer and a second p-type cladding layer with a thickness of 25 nm formed immediately on the first p-type cladding layer. Here, the Al content of the first p-type cladding layer was gradually reduced from 0.7 to 0.35 by continuously changing the flow rate of TMA from 150 sccm to 75 sccm. Further, the Al content of the second p-type cladding layer was fixed at 0.35. Note that the reduction rate of the Al content of the first p-type cladding layer in the thickness direction was 0.014/nm.

Comparative Example 5

A nitride semiconductor light-emitting device in accordance with Comparative Example 5 was fabricated under entirely the same conditions as Comparative Example 4 except that the Al content of the first p-type cladding layer was fixed at 0.35 and the Al content of the second p-type cladding layer was gradually reduced from 0.35 to 0 by continuously changing the flow rate of TMA from 75 sccm to 0 sccm. Note that the reduction rate of the Al content of the second p-type cladding layer in the thickness direction was 0.014/nm.

<Evaluation of Light Emission Characteristics>

The light output power Po (mW) of the flip-chip III nitride semiconductor light-emitting device fabricated in accordance with Example 1 was measured at a current of 20 mA using an integrating sphere and was 2.0 mW. Similarly, the device of Example 2 was evaluated; the light output power thereof was measured and was 1.9 mW. Meanwhile, the light output powers were measured with respect to Conventional Example and Comparative Examples 1 to 5, and were 2.3 mW (Conventional Example), 2.1 mW (Comparative Example 1), 1.5 mW (Comparative Example 2), 1.6 mW (Comparative Example 3), 2.1 mW (Comparative Example 4), and 2.0 mW (Comparative Example 5), respectively. Thus, in Examples 1 and 2, a light output power as high as Conventional Example was achieved. The obtained results are shown with the forward voltage $V_f$ in Table 1. Note that the emission peak wavelength was 280±5 nm in each device.

TABLE 1

| | Electron blocking layer | | | p-type cladding layer | | | | p-type contact layer | | Light output power $P_o$ (mW) | Forward voltage $V_f$ (V) | Residual output |
|---|---|---|---|---|---|---|---|---|---|---|---|---|---|
| | Layer structure | Thickness (nm) | Al content x | Layer structure | Thickness (nm) | Al content z | Reduction rate of Al content (/nm) | Thickness (nm) | Al content y | | | |
| Example 1 | One-layer | 40 | 0.7 | One-layer | 50 | Gradually decrease from 0.7 to 0 | 0.014 | 180 | 0 | 2.0 | 6.9 | 98% |
| Example 2 | One-layer | 40 | 0.7 | One-layer | 25 | Gradually decrease from 0.7 to 0.35 | 0.014 | 180 | 0 | 1.9 | 6.7 | 96% |
| Conventional Example | One-layer | 40 | 0.7 | One-layer | 50 | Fixed at 0.35 | 0 | 180 | 0 | 2.3 | 6.4 | 88% |
| Comparative Example 1 | One-layer | 20 | 0.7 | Two-layer | 20, 50 | Fixed at 0.5, Fixed at 0.35 | 0, 0 | 180 | 0 | 2.1 | 6.7 | 90% |
| Comparative Example 2 | One-layer | 40 | 0.7 | One-layer | 25 | Gradually decrease from 0.7 to 0 | 0.028 | 180 | 0 | 1.5 | 6.5 | 91% |
| Comparative Example 3 | One-layer | 40 | 0.7 | One-layer | 50 | Gradually decrease from 0.7 to 0.35 | 0.007 | 180 | 0 | 1.6 | 6.7 | 52% |
| Comparative Example 4 | One-layer | 40 | 0.7 | Two-layer | 25, 25 | Gradually decrease from 0.7 to 0.35, Fixed at 0.35 | 0.014, 0 | 180 | 0 | 2.1 | 6.7 | 90% |
| Comparative Example 5 | One-layer | 40 | 0.7 | Two-layer | 25, 25 | Fixed at 0.35, Gradually decrease from 0.35 to 0 | 0.014, 0 | 180 | 0 | 2.0 | 6.7 | 90% |

<Evaluation of Light Emission Lifetime>

In order to determine the life characteristics, the residual output of the of the III nitride semiconductor light-emitting device of Example 1 after the device had been energized for one hour (output after 1 h energization/initial light output) was measured and was 98% to the initial output. Similarly, the residual output after 1 h energization was measured in Example 2 and was 96%. Meanwhile, the residual outputs in Conventional Example and Comparative Examples 1 to 5 were 88% (Conventional Example), 90% (Comparative Example 1), 91% (Comparative Example 2), 52% (Comparative Example 3), 90% (Comparative Example 4), and 90% (Comparative Example 5), respectively. Thus, in Examples 1 and 2, the emission lifetime was found to be significantly improved as compared with Conventional Example and Comparative Examples.

The comparison of Example 1 with Comparative Examples 4 and 5 shows that the residual output is increased by gradually reducing the Al content of the p-type cladding layer over the whole thickness of the p-type cladding layer. Further, the comparison between Example 1 and Example 2 shows that the residual output is increased by gradually reducing the Al content of the p-type cladding layer from the Al content of the electron blocking layer to the Al content of the p-type contact layer. The obtained results are shown in Table 1.

INDUSTRIAL APPLICABILITY

Thus, the Al content of a p-type cladding layer is gradually reduced over the whole thickness of the p-type cladding layer from the electron blocking layer side toward the p-type contact layer side and the rate of reduction of the Al content of the p-type cladding layer in the thickness direction is 0.01/nm or more and 0.025/nm or less. Thus, a long-life III nitride semiconductor light-emitting device can be obtained, which is beneficial for the production of a light-emitting device.

The invention claimed is:

1. A III nitride semiconductor light-emitting device including an n-type semiconductor layer; a light emitting layer containing at least Al; and a p-type semiconductor layer obtained by sequentially stacking an electron blocking layer, a p-type cladding layer, and a p-type contact layer, in this order, wherein:
the electron blocking layer is made of $Al_xGa_{1-x}N$, x being in the range from 0.55 to 1.0,
light emitted from the light emitting layer is deep ultraviolet light having a center wavelength of 320 nm or less,
the p-type contact layer is made of $Al_yGa_{1-y}N$, y being in the range from 0 to 0.1,
the p-type cladding layer is made of $Al_zGa_{1-z}N$ having an Al content z which gradually decreases over the whole thickness of the p-type cladding layer from the electron blocking layer side toward the p-type contact layer side, and
the reduction rate of the Al content z of the p-type cladding layer in the thickness direction is 0.01/nm or more and 0.025/nm or less.

2. The III nitride semiconductor light-emitting device according to claim 1, wherein change in the Al content z of the p-type cladding layer from the interface between the p-type cladding layer and the electron blocking layer to the interface between the p-type cladding layer and the p-type contact layer is (x−y)/2 or more.

3. The III nitride semiconductor light-emitting device according to claim 1, wherein the Al content z of the p-type cladding layer gradually decreases from the Al content x of the electron blocking layer or less.

4. The III nitride semiconductor light-emitting device according to claim 1, wherein the Al content z of the p-type cladding layer gradually decreases down to the Al content y of the p-type contact layer or more.

5. A method of producing a III nitride semiconductor light-emitting device including an n-type semiconductor layer; a light emitting layer containing at least Al; and a p-type semiconductor layer in in this order, wherein
light emitted from the light emitting layer is deep ultraviolet having a center wavelength of 320 nm or less;
a step of forming the p-type semiconductor layer comprises:
an electron blocking layer formation step for forming an electron blocking layer made of $Al_xGA_{1-x}N$ on the light emitting layer, x being in the range from 0.55 to 1.0;
a p-type cladding layer formation step for forming a p-type cladding layer made of $Al_zGA_{1-z}N$ on the electron blocking layer; and
a p-type cladding layer formation step for forming a p-type contact layer made of $Al_yGA_{1-y}N$ on the p-type cladding layer, y being in the range from 0 to 0.1,
the Al content z of the p-type cladding layer is gradually reduced over the whole thickness of the p-type cladding layer from the electron blocking layer side toward the p-type contact layer side, and
the reduction rate of the Al content z of the p-type cladding layer in the thickness direction is 0.01/nm or more and 0.025/nm or less.

* * * * *

UNITED STATES PATENT AND TRADEMARK OFFICE
CERTIFICATE OF CORRECTION

PATENT NO. : 9,882,088 B2  
APPLICATION NO. : 15/066234  
DATED : January 30, 2018  
INVENTOR(S) : Yasuhiro Watanabe Page 1 of 1

It is certified that error appears in the above-identified patent and that said Letters Patent is hereby corrected as shown below:

In the Claims

Claim 5, Line 15 (Column 6, Line 40), "p-type cladding layer" should read ---p-type contact layer---.

Signed and Sealed this  
Fifth Day of February, 2019

Andrei Iancu  
*Director of the United States Patent and Trademark Office*